United States Patent [19]

Franks

[11] 3,987,288
[45] Oct. 19, 1976

[54] TIME MULTIPLEXING HYBRID SAMPLE DATA FILTER

[75] Inventor: Lewis E. Franks, Amherst, Mass.

[73] Assignee: The United States of America as represented by the Secretary of the Air Force, Washington, D.C.

[22] Filed: Apr. 22, 1975

[21] Appl. No.: 570,987

[52] U.S. Cl. .............................. 235/152; 325/38 B; 332/11 D
[51] Int. Cl.² ......................................... G06F 15/34
[58] Field of Search ........... 235/152, 156; 325/38 B, 325/42; 332/11 D; 328/163

[56] References Cited
UNITED STATES PATENTS

| | | | |
|---|---|---|---|
| 3,633,170 | 1/1972 | Jones, Jr. .................... | 325/38 B X |
| 3,814,917 | 6/1974 | Nussbaumer ..................... | 235/152 |
| 3,822,404 | 7/1974 | Croisier et al. ................ | 325/38 B X |
| 3,906,400 | 9/1975 | Gooding et al. .................. | 332/11 D |

OTHER PUBLICATIONS

G. B. Lockhart, "Digital Encoding & Filtering Using Delta Modulation" The Radio & Elect. Engr. vol. 42, No. 12, Dec. 1972, pp. 547–551.
Peled & Liv, "A New Approach to the Realization of Nonrecursive Digital Filters" IEEE Trans. on Audio & Electro. vol. AU–21, No. 6, Dec. 1973, pp. 477–484.

Primary Examiner—David H. Malzahn
Attorney, Agent, or Firm—Joseph E. Rusz; Julian L. Siegel

[57] ABSTRACT

A hybrid sample data filter system using quantized data of an analog signal obtained from a delta modulator. A shift register having N preselected taps is fed by the delta modulator. Each of the N taps are fed to a series of AND gates corresponding to the R stages of a coefficient counter and between the stages of the coefficient counter and the AND gates are coefficient setting switches set in accordance with the predetermined weighting of the output taps of the shift register. A ring counter having N stages is also fed to the AND gates for time mutliplexing with each of the stages of the ring counter feeding those AND gates that are fed by the corresponding tap of the shift register. Each of the AND gates fed by the same stage of the R stage coefficient counter is combined in one of a series of N-input OR gates, the output of which is fed to a R-input digital-to-analog converter. A demodulating filter is then connected to the output of the digital-to-analog filter.

4 Claims, 3 Drawing Figures

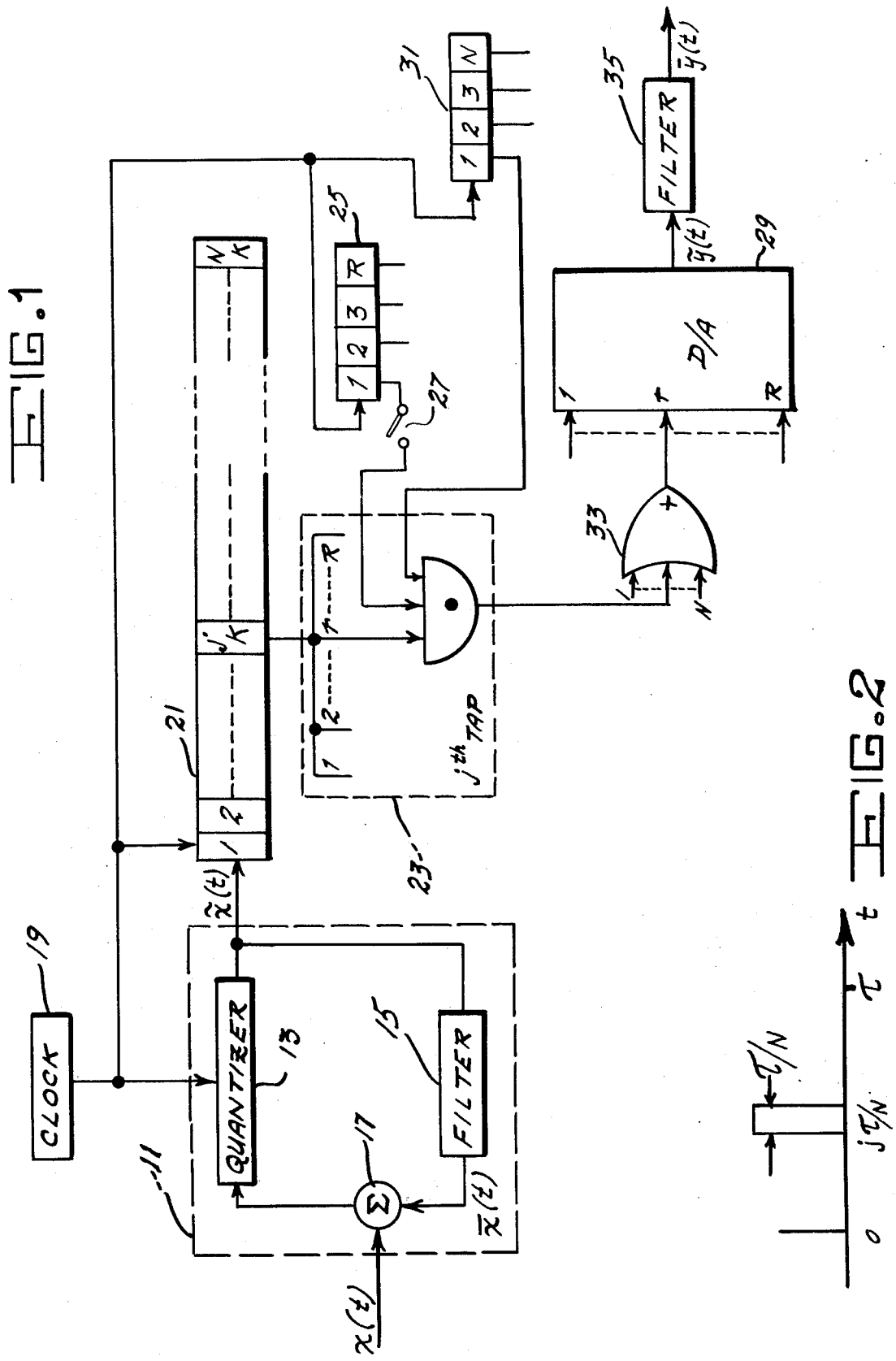

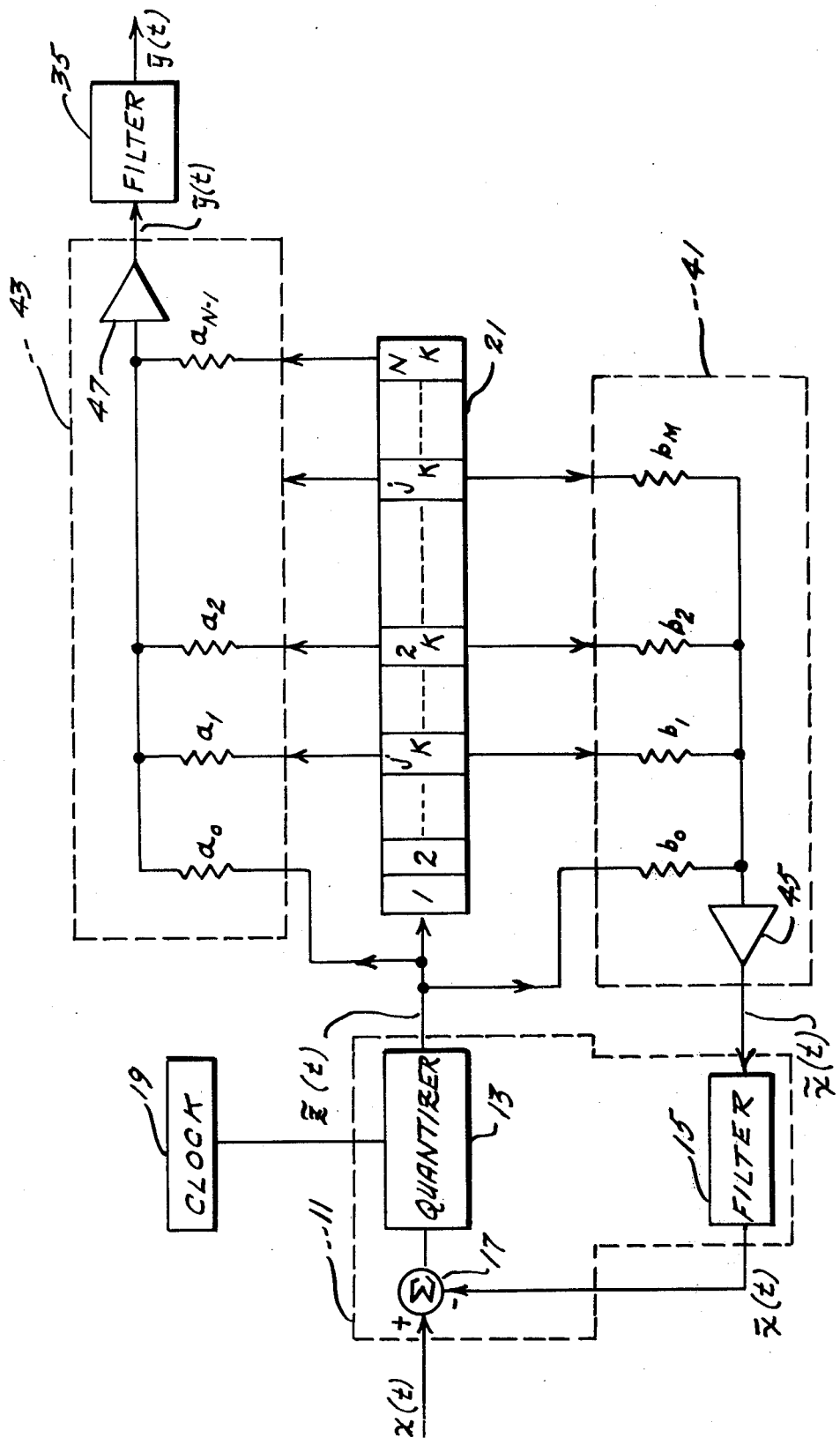

TIME MULTIPLEXING HYBRID SAMPLE DATA FILTER

STATEMENT OF GOVERNMENT INTEREST

The invention described herein may be manufactured and used by or for the Government for governmental purposes without the payment of any royalty thereon.

BACKGROUND OF THE INVENTION

This invention relates to sample data filtering, and more particularly to a hybrid time multiplexing sample data filter using delta modulation.

The conventional delta modulator uses a 1-bit quantizer (comparator) which is clocked every $\tau$ seconds to produce a binary pulse sequence output, $\bar{x}(t)$, $$x(t) = \sum_{k=-\infty}^{\infty} d_k s(t-k\tau)$$

where $$d_k = \frac{1}{2} + \frac{1}{2} \text{sgn}\,[x(k\tau) - \bar{x}(k\tau)]$$

and $s(t)$ is a rectangular pulse of width $\tau$. The signal $\bar{x}(t)$ is the demodulated version of $\bar{x}(t)$ and is obtained by passing the binary signal through a low pass filter which can be an integrator. The gain of the filter has a scaling factor that can be adjusted so that the occurrence of slope overload can be made sufficiently infrequent. The demodulated signal exhibits a quantizing noise which depends jointly on the sampling rate ($1/\tau$) and the step size ($\Delta$) which is the amount of jump in the response of the filter to a single pulse, $s(t)$.

The feature of primary significance is that demodulation is accomplished with a linear, time-invariant network which means that the linear operations of multiplication by a constant (scaling), summation, and delaying, to be performed on the demodulated signal, can equivalently be performed on the delta-encoded signal. For the nonrecursive case, these operations on $\bar{x}(t)$ can be performed by a device known as a binary transversal filter (BTF). This device consists of a shift register (clocked at rate $1/\tau$) to provide delayed versions of the signal, and a resistance weighting network to scale and sum the individual terms. The BTF has received considerable attention as a means for generating digital signalling waveforms. The shift register is tapped at every $k^{th}$ stage to provide the signals into the resistance weighting network. Negative scaling factors are accommodated by having a separate summing node for one of the inputs to a difference amplifier. The parameter $k = T/\tau$ is the ratio of sampling rate in $\Delta M$ to sampling rate in PCM and it essentially characterizes the error in the $\Delta M$ conversion process. Depending on accuracy requirements, values of $k$ between 10 and 1000 might be needed.

The binary transversal filter performs only the delay operation digitally. The scaling and summing operations require careful selection of resistance values and one of the desirable features of a digital filter is missing. The digital filter allows arbitrary scaling coefficients to be programmed in so that one structure can serve many filtering functions.

The present invention incorporates the delta modulation scheme by means of digitally-controlled pulse-width modulation. The demodulator response is essentially independent of the shape of the individual binary pulses since their bandwidth greatly exceeds the bandwidth of the demodulator. Hence the demodulator output can be scaled by changing the width, rather than the height, of the pulses in the $\Delta M$ signal. Assuming that prescaling has been done so that $|aj| \leqslant$; $j = 0, 1, ..., N-1$, the outputs of the pulsewidth modulators at each tap are combined in an analog fashion to provide the signal.

$$\tilde{y}(t) = \sum_{j=0}^{N-1} \sum_{k=-\infty}^{\infty} d_k \, \text{sgn}\,(a_j)\, s\left(\frac{t - k\tau - jT}{|a_j|}\right)$$

and $\bar{y}(t) = F.\tilde{y}(t)$ is the desired approximation to the nonrecursive version.

SUMMARY OF THE INVENTION

This invention provides an alternate means for performing the multiplications and additions required in the hybrid sample data filter previously described. In the present system, the multiplication is performed by an array of AND gates (no carry operations are required since the signal is a sequence of 1-bit words), and the addition, although an analog operation, can be performed with digital circuit elements through the use of a time-division multiplexing process.

It is therefore an object of this invention to provide a novel and improved sample data filter over those used in the post which is more economical and practical to implement.

It is another object to provide a sample data filter in which scaling is performed by the adjustment of width rather than by height.

It is still another object to provide a sample data filter using a shift register that is tapped only at selective stages instead of at every stage.

It is yet another object to provide a sample data filtering using time-division multiplexing.

These and other objects, features and advantages of the invention will become more apparent from the following description when taken in conjunction with the illustrative embodiments in the accompanying drawings, wherein:

DESCRIPTION OF THE DRAWINGS

FIG. 1 is a block diagram of the nonrecursive hybrid sample data filter using a time multiplexing;

FIG. 2 is a diagram showing the multiplexing signal used in the embodiment of FIG. 1; and FIG. 3 is a block diagram of a recursive hybrid sample data filter.

DETAILED DESCRIPTION OF THE PREFERRED EMBODIMENT

An embodiment of the invention shown in FIG. 1 uses delta modulator 11 to convert the analog signal $x(t)$ to the quantized signal $\bar{x}(t)$. Delta modulator 11 includes 1-bit quantizer 13, feedback demodulator 15, and summer 17. Quantizer 13 is pulsed by clock 19 which has a pulse frequency of $1/\tau$. The output of delta modulator 11 is fed to shift register 21 which has a tap at every $k^{th}$ stage and has a total of N/K taps. The delta modulator signal at each tap can be regarded as a sequence of 1-bit words each to be multiplied by a R-bit coefficient word to be obtained from counter 25. The product is one of two possible R-bit words and is performed by a set of R AND gates, one of which is shown at 23. There are a total of NR 3-input AND gates. The weighting of the N taps is performed by connecting the R stages of synchronous coefficient counter 25 to AND gates 23 and activating selected coefficient switches 27. Corresponding bits from each tap are combined in an analog fashion and routed to the appropriate input of the R inputs in circuit 29. This device is the analog portion of a conventional digital-to-analog converter, i.e., a resistance weighting network or a R/2R ladder network which is described by T. P. Sifferlen and V. Vartanian, in "Digital Electronics with Engineering Applications," published by Prentice-Hall, 1970. The output of circuit 29 is $$v_o(t) = \sum_{i=1}^{R} 2^{-i} v_i(t)$$

with analog inputs $v_1(t), v_2(t), ... v_R(t)$. Since the demodulated signal depends only on the time intergral over each $\tau$-second interval, it is possible to perform the analog combination of the $R^{th}$ bits from each tap by time-division multiplexing implemented with digital circuits. To accomplish this, a multiplexing signal, $cj(t)$, is also applied to AND gate 23 for the $j^{th}$ tap. This signal has a pulse which appears in the $j^{th}$ time slot out of N for each $\tau$-second interval and the pulse signal is shown in FIG. 2. The set of multiplexing signals $c_1(t), c_2(t), ... c_N(t)$ can be obtained from the different stages of an N-stage ring counter 31, clocked at rate N/$\tau$. The AND gate outputs (for each bit) are combined in OR gate 33. These are R N-input OR gates. The time integral of the outputs of OR gates 33 over one $\tau$-second interval can take on one of N + 1 possible levels. The analog summation is thus performed with digital circuits without the possibility of overflow. The output of digital-to-analog converter 29 is fed to demodulator 35. These two circuits are the only analog elements in the filter. With this type of multiplexing, is is more accurate to take the delay between taps as T = (K + 1/N)$\tau$ rather than T = K$\tau$.

The recursive embodiment of the hybrid sample data filter is shown in FIG. 3. Here delta modulator 11 and its inclusive elements, quantizer 13, filter 15, and summer 17 are the same as that shown in the embodiment of FIG. 1, as are clock 19, shift register 21, and filter 35. Resistance weighting networks 41 and 43 are connected to selected $jK$ taps of shift register 21. Network 41 includes resistance $b_0, B_1, ... b_M$, which weight the delayed outputs from shift register 21 and are summed in summing amplifier 45 and its output is fed to delta modulator 11 to complete the recursive loop. Network 43 includes resistance $a_0, a_1, ... a_{M-1}$, which also connect to the selected taps of shift register 21. These resistances weigh the delayed outputs which are summed in summing amplifier 45 and fed to filter 35.

What is claimed is:
1. A hybrid sample data filter comprising:
 a. a clock;
 b. a delta modulator pulsed by the clock;
 c. a shift register having N output taps and being fed by the delta modulator and being pulsed by the clock;
 d. a coefficient counter pulsed by the clock and having R output stages;
 e. a plurality of means for multiplying each of the N outputs of the shift register with each of the R outputs of the coefficient counter;
 f. a plurality of R OR gates fed by the plurality of multiplying means with each of the R OR gates having N inputs;
 g. a digital-to-analog converter fed by the plurality of OR gates; and
 h. a demodulator fed by the digital-to-analog converter.

2. A hybrid sample data filter according to claim 1 wherein the plurality of multiplying means comprises a plurality of AND gates.

3. A hybrid sample data filter according to claim 2 which further comprises means for time multiplexing the outputs of the plurality of AND gates, the time multiplexing means including a ring counter having N stages with one each of the stages being fed to one each of the AND gates and being pulsed by the clock.

4. A hybrid sample data filter according to claim 3 which further comprises a plurality of switches one each interposed between the output stages of the coefficient counters and the plurality of AND gates.

* * * * *